United States Patent
Iwamoto

(10) Patent No.: US 8,889,452 B2
(45) Date of Patent: *Nov. 18, 2014

(54) PIEZOELECTRIC DEVICE AND METHOD FOR MANUFACTURING PIEZOELECTRIC DEVICE

(75) Inventor: Takashi Iwamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 44 days.

This patent is subject to a terminal disclaimer.

(21) Appl. No.: 13/455,378

(22) Filed: Apr. 25, 2012

(65) Prior Publication Data
US 2012/0205754 A1 Aug. 16, 2012

Related U.S. Application Data

(63) Continuation of application No. PCT/JP2010/068886, filed on Oct. 26, 2010.

(30) Foreign Application Priority Data

Oct. 30, 2009 (JP) ................. 2009-250121

(51) Int. Cl.
| | |
|---|---|
| H01L 29/84 | (2006.01) |
| H03H 9/17 | (2006.01) |
| H03H 9/05 | (2006.01) |
| H03H 9/02 | (2006.01) |
| H03H 3/02 | (2006.01) |

(52) U.S. Cl.
CPC ............. *H03H 9/173* (2013.01); *H03H 9/0523* (2013.01); *H03H 9/02228* (2013.01); *H03H 3/02* (2013.01); *H03H 2003/021* (2013.01)
USPC ..................................... 438/53; 257/E29.001

(58) Field of Classification Search
USPC ............... 257/415, E29.324, E21.001; 438/53
See application file for complete search history.

(56) References Cited

U.S. PATENT DOCUMENTS

| | | | |
|---|---|---|---|
| 8,339,015 B2 * | 12/2012 | Iwamoto et al. | .......... 310/313 R |
| 2007/0199186 A1 | 8/2007 | Yoshino et al. | |
| 2007/0210878 A1 | 9/2007 | Yamaguchi et al. | |

FOREIGN PATENT DOCUMENTS

| | | |
|---|---|---|
| JP | 62-76913 A | 4/1987 |
| JP | 2000-196407 A | 7/2000 |

(Continued)

OTHER PUBLICATIONS

Official Communication issued in International Patent Application No. PCT/JP2010/068886, mailed on Jan. 25, 2011.

*Primary Examiner* — Roy Potter
(74) *Attorney, Agent, or Firm* — Keating & Bennett, LLP

(57) ABSTRACT

A piezoelectric device includes a piezoelectric thin film formed by separating and forming a piezoelectric single crystal substrate, an inorganic layer formed on a back surface of the piezoelectric thin film, an elastic body layer disposed on a surface opposite to the piezoelectric thin film of the inorganic layer, and a support pasted to a surface opposite to the inorganic layer of the elastic body layer. In a membrane structure portion, the inorganic layer and the elastic body layer are disposed on the piezoelectric thin film through a gap layer. The elastic body layer reduces a stress caused by pasting the piezoelectric thin film including the inorganic layer and the support and has a certain elastic modulus. The inorganic layer is formed with a material having an elastic modulus higher than that of the elastic body layer and suppresses damping caused by disposing the elastic body layer.

6 Claims, 8 Drawing Sheets

(56) References Cited

FOREIGN PATENT DOCUMENTS

| | | | |
|---|---|---|---|
| JP | 2003-17967 A | 1/2003 | |
| JP | 2004-312201 A | 11/2004 | |
| JP | 2007-228319 A | 9/2007 | |
| JP | 2008-42871 A | 2/2008 | |
| JP | 2008-118079 A | 5/2008 | |

* cited by examiner

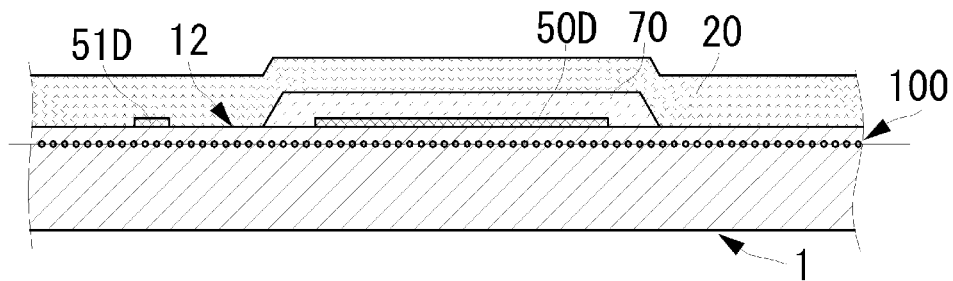
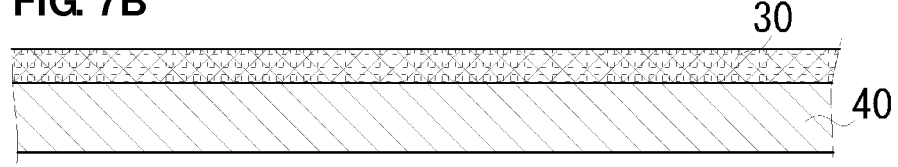
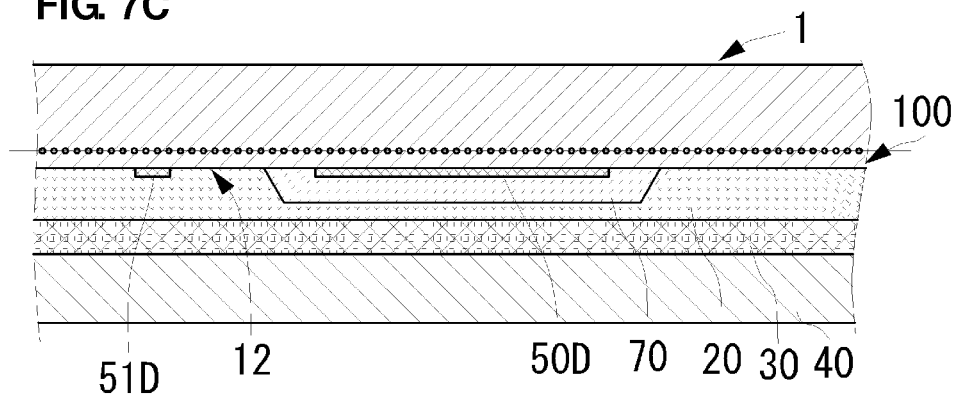
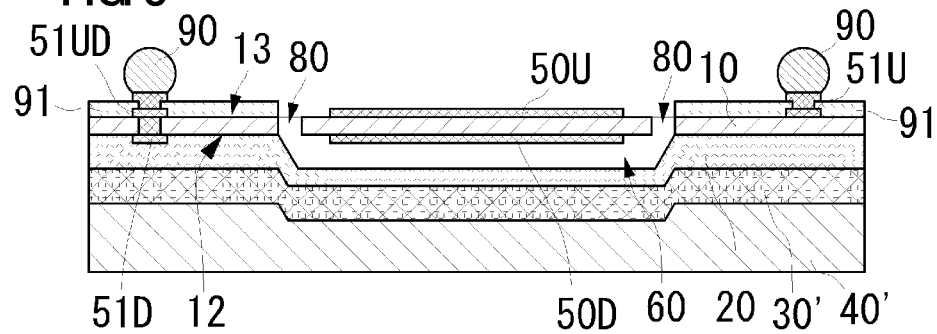

PIEZOELECTRIC DEVICE AND METHOD FOR MANUFACTURING PIEZOELECTRIC DEVICE

BACKGROUND OF THE INVENTION

1. Field of the Invention

The present invention relates to a piezoelectric device including a piezoelectric single crystal thin film, and more specifically a piezoelectric device including a membrane structure, and a method for manufacturing the piezoelectric device.

2. Description of the Related Art

Currently, a large number of piezoelectric devices in which a piezoelectric single crystal body is formed in a thin film have been developed. In the piezoelectric devices containing such a piezoelectric thin film, a support member for supporting the piezoelectric thin film is required in practical use. Such a support member is disposed on one principal surface of the piezoelectric thin film as described in Japanese Unexamined Patent Application Publication No. 2007-228319 or Japanese Unexamined Patent Application Publication No. 2003-17967.

Some of the piezoelectric devices have a membrane structure in which, a space is formed between a region in which an electrode which functions as the piezoelectric device in the piezoelectric thin film is formed and the support member, in order to increase the characteristics of the devices.

Heretofore, a smart cut method has been used as one of the methods for forming a composite piezoelectric substrate containing a piezoelectric thin film and a support member. According to the smart cut method, an ion implanted layer is formed by implanting ions into one principal surface of a piezoelectric substrate having a joinable thickness. Next, the support member which is separately formed is joined to the principal surface at the ion implanted layer side of the piezoelectric substrate on which the ion implanted layer is formed by using an activation junction, affinity junction, or the like. Thereafter, the piezoelectric thin film is separated by heating from the piezoelectric substrate utilizing the ion implanted layer.

Therefore, when forming the piezoelectric device having the membrane structure, a sacrificial layer which serves as a gap layer later is formed on one surface of the piezoelectric substrate, and then the support member is joined to the front surface of the piezoelectric substrate on which the sacrificial layer is formed. Thereafter, the piezoelectric thin film is separated from the piezoelectric substrate to be formed, etching windows are formed in the piezoelectric thin film, and then the sacrificial layer is removed from the etching windows. In this case, a structure in which the piezoelectric thin film and the support member are joined to each other at portions other than the membrane structure portion is formed.

Mentioned as a method of joining the substrate for separating and forming a thin film and the support member is a method including placing an elastic body between a single crystal silicon substrate, which is not a composite piezoelectric substrate, and a support as described in Japanese Unexamined Patent Application Publication No. 2008-118079.

However, when directly joining a piezoelectric substrate and a support member as described in Japanese Unexamined Patent Application Publication No. 2007-228319 or Japanese Unexamined Patent Application Publication No. 2003-17967, the coefficient of linear expansion difference between the piezoelectric substrate and the support member cannot be disregarded, and therefore materials of the support member are considerably limited. Moreover, in order not to apply unnecessary stress to the piezoelectric substrate during the junction process, it is required to set strict joining conditions in such a manner that irregularities exceeding a certain level are not present or particles (foreign substances, dust, or the like of a minimum size) are not present on a joined surface, which increases the process load and makes the process control difficult.

In particular, when forming the membrane structure, not only the flatness degree of the piezoelectric substrate surface but the flatness degree of the sacrificial layer surface needs to increase. The sacrificial layer surface and the piezoelectric substrate surface cannot form the same plane in terms of a manufacturing process. Therefore, in order to increase the flatness degree thereof to a certain level or higher, the process load increases, which leads to an increase in cost.

In contrast, as described in Japanese Unexamined Patent Application Publication No. 2008-118079, various problems occurring when joining the piezoelectric substrate and the support member as described above are lessened by inserting an elastic body between the semiconductor substrate and the support member. However, by joining an elastic body with a low elastic coefficient to the piezoelectric substrate, damping occurs, so that the function as the piezoelectric device decreases. This phenomenon arises without exception even in the case of the membrane structure because at least a portion where the piezoelectric thin film and the elastic body are joined to each other is present. Particularly in a piezoelectric device utilizing elastic waves, the influence is considerable.

SUMMARY OF THE INVENTION

Therefore, preferred embodiments of the present invention provide a piezoelectric device including a membrane structure in which the occurrence of the above-described various problems during the junction process are prevented and in which the function does not decrease in terms of the structure, and also provide a method for manufacturing the piezoelectric device.

According to a preferred embodiment of the present invention, a piezoelectric device includes a piezoelectric thin film on which a drive electrode is provided and a support member disposed on one principal surface side of the piezoelectric thin film and including a membrane structure in which a gap layer is provided between a region in which the drive electrode is provided on the piezoelectric thin film and the support member. Between the piezoelectric thin film and the support member of the piezoelectric device, an elastic body layer and an inorganic layer which is located at the piezoelectric thin film side of the elastic body layer and includes a material with a higher elastic modulus and a higher hardness as compared with the elastic body layer, are provided.

In this configuration, since a composite layer including the piezoelectric thin film and the inorganic layer is joined to the support member through the elastic body layer, the material of the support member having a larger thickness than the thickness of the piezoelectric thin film and the inorganic layer can be selected without considering a difference of the coefficient of linear expansion from that of the piezoelectric thin film. Due to the fact that the inorganic layer is inserted between the elastic body layer and the piezoelectric thin film, damping caused by the elastic body layer does not occur.

The elastic body layer of a piezoelectric device according to a preferred embodiment of the present invention preferably includes an inorganic filler. In this configuration, due to the fact that an inorganic filler is compounded in the elastic body layer, the thermal conductivity of the elastic body layer can be increased and the coefficient of linear expansion can be reduced and also the elastic modulus can also be increased. Thus, various characteristics, such as the power durability and the temperature characteristics of the piezoelectric device, particularly a device utilizing acoustic waves, can be improved.

For the inorganic layer of a piezoelectric device according to a preferred embodiment of the present invention, a material having a thermal conductivity higher than that of the piezoelectric thin film is preferably used. In this configuration, since heat generated in the piezoelectric thin film is effectively transmitted to the inorganic layer, the power durability of acoustic waves device can be increased.

For the elastic body layer of a piezoelectric device according to a preferred embodiment of the present invention, a material having a thermal conductivity higher than that of the piezoelectric thin film and the inorganic layer is preferably used. In this configuration, since heat is effectively transmitted from the piezoelectric thin film to the elastic body layer through the inorganic layer, the power durability can be further increased.

For the inorganic layer of a piezoelectric device according to a preferred embodiment of the present invention, a material having a coefficient of linear expansion lower than that of the piezoelectric thin film is preferably used. In this configuration, since the inorganic layer is more difficult to deform than the piezoelectric thin film, the inorganic layer can constrain the piezoelectric thin film, and the temperature characteristics as a piezoelectric device can be increased.

The piezoelectric thin film of a piezoelectric device according to a preferred embodiment of the present invention preferably includes a material made of a Group 1 element. In this configuration, when the material made of a Group 1 element, such as LT, LN, and LBO, is used for the piezoelectric thin film, the position of the Group 1 element in the crystal is displaced due to ion implantation, so that internal stress is accumulated to cause cleavage in the thin film, and therefore cracking is likely to occur. However, by inserting the elastic body layer and the inorganic layer between the support member and the piezoelectric thin film, the support member is indirectly joined to the piezoelectric thin film, so that the defective fraction due to cracking during junction can be particularly reduced.

According to another preferred embodiment of the present invention, a method for manufacturing a piezoelectric device includes an ion implantation process for implanting ionized elements into a piezoelectric substrate to thereby form a portion in which a concentration of the elements implanted into the piezoelectric substrate reaches a peak in the piezoelectric substrate, a sacrificial layer formation process for forming a sacrificial layer on a surface at the ion implanted side of the piezoelectric substrate, an inorganic layer formation process for directly forming an inorganic layer on a surface at the ion implanted side of the piezoelectric substrate on which the sacrificial layer is formed, an elastic body layer disposing process for disposing an elastic body layer on a surface opposite to the piezoelectric substrate of the inorganic layer, a pasting process for pasting a support member to the elastic body layer, a peeling process for peeling and forming the piezoelectric thin film from the piezoelectric substrate in which the portion in which the concentration of the elements implanted into the piezoelectric substrate reaches the peak is formed, and a sacrificial layer removal process for removing the sacrificial layer to thereby form a gap layer.

According to the manufacturing method, the above-described piezoelectric device including a piezoelectric thin film, an inorganic layer, an elastic body layer, and a support member and including the membrane structure can be easily manufactured. In this case, by directly forming on the piezoelectric substrate with the sacrificial layer without using a junction of the inorganic layer, and further disposing the elastic body layer, problems occurring when joining the piezoelectric substrate and the support member are prevented. When the piezoelectric substrate including the sacrificial layer, the composite layer including the inorganic layer and the elastic body layer, and the support member, the inorganic layer serves as a protective layer of the piezoelectric substrate with the sacrificial layer and the elastic body layer serves as a buffer layer and a level difference reduction layer, problems occurring during a junction process or conventional problems described above do not occur. Thus, a piezoelectric device with high reliability and good characteristics can be manufactured with ease and with a high yield.

According to a further preferred embodiment of the present invention, a method for manufacturing a piezoelectric device includes an ion implantation process for implanting ionized elements into a piezoelectric substrate to thereby form a portion in which a concentration of the elements implanted into the piezoelectric substrate reaches a peak in the piezoelectric substrate, a sacrificial layer formation process for forming a sacrificial layer on a surface at the ion implanted side of the piezoelectric substrate, an inorganic layer formation process for directly forming an inorganic layer on a surface at the ion implanted side of the piezoelectric substrate on which the sacrificial layer is formed, an elastic body layer disposing process for disposing an elastic body layer on a front surface of the support member, a pasting process for pasting the inorganic layer and the elastic body layer, a peeling process for peeling and forming the piezoelectric thin film from the piezoelectric substrate in which the portion in which the concentration of the elements implanted into the piezoelectric substrate reaches the peak is formed, and a sacrificial layer removal process for removing the sacrificial layer to thereby form a gap layer.

According to the manufacturing method described in the preceding paragraph, the elastic body layer is formed at the support member side, and then a first composite layer containing the piezoelectric substrate with the sacrificial layer and the inorganic layer and a second composite layer containing the support member and the elastic body layer are pasted to each other in contrast to the above-described manufacturing method in which the piezoelectric substrate with the sacrificial layer is formed and the elastic body layer is formed at the inorganic layer side, and then the elastic body layer and the support member are pasted to each other. By providing such a process, the elastic body layer before pasting can be subjected to heat treatment with a heat temperature higher than the peeling temperature of the portion where the concentration of the elements implanted into the piezoelectric substrate reaches the peak. Thus, annealing (removal of an unnecessary solvent) treatment of the elastic body layer can be facilitated, for example, so that the reliability can be further increased.

According to a preferred embodiment of a method for manufacturing a piezoelectric device of the present invention, the pasting process is preferably performed under reduced pressure. Due to the fact that the pasting process is preferably performed under reduced pressure, foams can be suppressed in the vicinity of the interface of the elastic body layer, so that the reliability can be increased. Furthermore, since the heat treatment temperature can be made low, adverse effects, such as a deterioration of the cleavability or a deterioration of the characteristics of the piezoelectric substrate due to heat treatment can be prevented.

According to a method for manufacturing a piezoelectric device of a preferred embodiment of the present invention, the inorganic layer formation process is preferably performed under reduced pressure. As a result, foams (voids) in the vicinity of the interface of the inorganic layer and the piezoelectric substrate can be prevented, so that a dense interface can be formed.

According to various preferred embodiments of the present invention, the occurrence of various problems during joining of the piezoelectric substrate with the sacrificial layer serving as the piezoelectric thin film in the piezoelectric device and the support member are prevented and the function as the piezoelectric device does not decrease. Thus, a piezoelectric device including a membrane structure in which the design degree of freedom is higher than before, the process control is easy, and the characteristics and the reliability are excellent, can be realized.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 7A-7C are views schematically illustrating manufacturing processes of the piezoelectric device formed according to a manufacturing flow chart illustrated in FIG. 6.

FIG. 8 is a side cross sectional view illustrating the configuration of a piezoelectric device having another configuration of the invention.

DETAILED DESCRIPTION OF THE PREFERRED EMBODIMENTS

A piezoelectric device according to a first preferred embodiment of the present invention and a method for manufacturing the piezoelectric device are described with reference to the drawings. In this preferred embodiment, the piezoelectric device is described taking a thin film type piezoelectric device for F-BAR containing a piezoelectric thin film as an example.

Figure 1A:
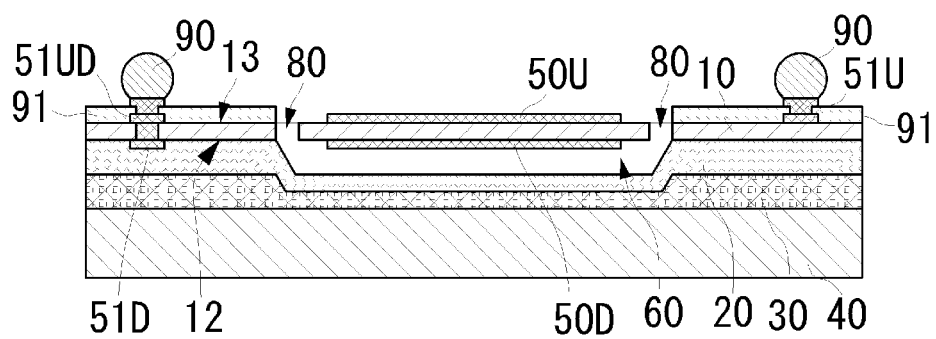
FIGS. 1A and 1B are a side cross sectional view illustrating the configuration of a piezoelectric device according to a first preferred embodiment of the present invention and a plan view as viewed from a mounting surface side thereof.
Figure 1B:
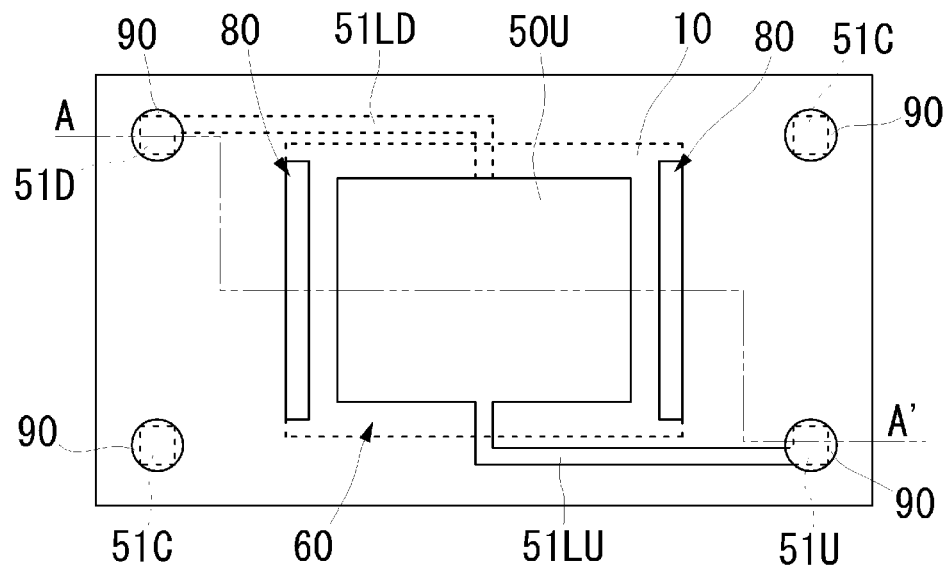

FIG. 1A is a side cross sectional view illustrating the configuration of the piezoelectric device according to the present preferred embodiment. FIG. 1B is a plan view of the piezoelectric device as viewed from the mounting surface side. In the plan view illustrated in FIG. 1B, the illustration of a solder resist 91 illustrated in FIG. 1A is omitted. FIG. 1A corresponds to the A-A' cross section of FIG. 1B.

The piezoelectric device includes a piezoelectric thin film 10 preferably having a thickness of about 1 μm made of a piezoelectric single crystal, such as LT, for example. For the piezoelectric thin film 10, in addition to LT, materials which have piezoelectricity and can be separated at a portion where the concentration of elements implanted into a piezoelectric substrate reaches the peak, such as LN, LBO ($Li_2B_4O_7$), langasite ($La_3Ga_5SiO_{14}$), KN ($KNbO_3$), and KLN ($K_3Li_2Nb_5O_{15}$), may be acceptable.

On a front surface 13 of the piezoelectric thin film 10, an upper electrode 50U, an upper drawing electrode 51LU, pad electrodes 51U, 51C, and 51UD are formed. The upper electrode 50U is formed in the shape of a flat plate having a certain area and is connected to the pad electrode 51U through the upper drawing electrode 51LU. The pad electrode 51C is formed independently from the other electrodes. The pad electrode 51UD is connected to the pad electrode 51D at the side of a back surface 12 through a via hole.

For the upper electrode 50U, Al, W, Mo, Ta, Hf, Cu, Pt, Ti, Au, or other suitable material preferably are used alone or in combination in accordance with the specification of the device, for example. In contrast, Al, Cu, and other suitable material are preferably used for the upper drawing electrode 51LU and the pad electrodes 51U, 51C, and 51UD, for example.

Furthermore, on the front surface 13 of the piezoelectric thin film 10, a solder resist 91 is formed. In this case, the solder resist 91 is preferably formed so as to exclude a region where a gap layer 60 described later is formed when the piezoelectric thin film 10 is viewed in plan. Moreover, the solder resist 91 is formed in such a manner as to exclude the top of the pad electrodes 51U, 51C, and 51UD. On the pad electrode 51U, 51C, and 51UD, bumps are formed and a soldering ball 90 is formed on each bump.

In contrast, on the back surface 12 of the piezoelectric thin film 10, a lower electrode 50D, a lower drawing electrode 51LD, and a pad electrode 51D are formed. The lower electrode 50D is formed so as to face the upper electrode 50U through the piezoelectric thin film 10. The lower electrode 50D is connected to the pad electrode 51D through the lower drawing electrode 51LD. For the lower electrode 50D, the same materials as those of the upper electrode 50U are preferably used. For the lower drawing electrode 51LD and the pad electrode 51D, the same materials as those of the upper drawing electrode 51LU and the pad electrodes 51U, 51C, and 51UD are preferably used.

Furthermore, an inorganic layer 20 is disposed so as to abut on the back surface 12 of the piezoelectric thin film 10, except for a region of a certain area including the formation region of the lower electrode 50D on the back surface 12 of the piezoelectric thin film 10. More specifically, the inorganic layer 20 is disposed at the back surface 12 side of the piezoelectric thin film 10 so that a gap layer 60 is formed in a region of a certain area including the formation region of the lower electrode 50D. Used as materials of the inorganic layer 20 are materials having an elastic modulus or hardness higher than a certain value under the use environment of general piezoelectric devices, e.g., at about −55° C. to about +150° C. Specifically, various kinds of metal oxides, such as a silicon oxide, a silicon nitride, an aluminum oxide, an aluminum nitride, a tantalum oxide, DLC (Diamond like Carbon), a magnesium oxide, and an yttrium oxide, or glass materials, such as PSG, are used. For the inorganic layer 20, materials having high thermal conductivity to the piezoelectric thin film 10 or materials having a low coefficient of linear expansion may be used. The inorganic layer may be formed of a plurality of layers, e.g., a two-layer structure of a layer having a low coefficient of linear expansion and a layer having high thermal conductivity.

On the surface of the inorganic layer 20 opposite to the piezoelectric thin film 10, an elastic body layer 30 is entirely formed. As materials of the elastic body layer 30, materials having a relatively low elastic modulus and low hardness are preferably used. Specifically, materials, such as resin materials, e.g., epoxy resin, polyimide resin, benzocyclobutene resin, heterocyclic olefin resin, and a liquid crystal polymer, are preferably used. For the elastic body layer 30, materials having high heat resistance or high chemical resistance may preferably be used. Particularly in the case of a device used at a high temperature of about 300° C. or higher, polyimide resin, benzocyclobutene resin, and a liquid crystal polymer are more preferably used. It is preferable also for the elastic body layer 30 to have high thermal conductivity.

By compounding an inorganic filler made of silica, alumina, or other suitable material in the elastic body layer 30, the elastic modulus, the hardness, the thermal conductivity, and also the coefficient of linear expansion can also be adjusted as appropriate.

To the surface of the elastic body layer 30 opposite to the inorganic layer 20, a support member 40 is pasted. For the support 40, materials which have excellent processability and are inexpensive are used. Specifically, Si, glass, and ceramics such as alumina, are used.

By providing such a layer configuration, various kinds of action effects described below can be obtained.

Since the support member 40 and a composite layer of the piezoelectric thin film and the inorganic layer 20 are joined (pasted) to each other through the elastic body layer 30, a level difference caused by irregularities and the like are absorbed by the elastic body layer 30, so that the generation of a local stress caused by the junction in the piezoelectric thin film 10 can be prevented even when the flatness degree of each interface during junction is not high. In particular, in the case of forming the membrane structure partially having the gap layer 60 between the above-described piezoelectric thin film 10 and the inorganic layer 20, a process is required which includes forming a sacrificial layer 70 made of a solid substance in a region serving as the gap layer 60, and removing the sacrificial layer 70 from etching windows 80 formed in the piezoelectric thin film 10 after joining to the support member as described below. The front surface of the sacrificial layer 70 is naturally projected from the back surface 12 of the piezoelectric thin film 10 (more correctly, the piezoelectric single crystal substrate 1 during the formation of the sacrificial layer 70). Therefore, it is not easy to simultaneously achieve a high flatness degree in the back surface 12 of the piezoelectric single crystal substrate 1 and the front surface of the sacrificial layer 70, and a level difference caused by irregularities and the like are more likely to occur than in the case where the membrane structure is not adopted. However, when the elastic body layer 30 according to a preferred embodiment of the present invention is provided, the influence of such a level difference is suppressed and the stress reducing action described above is obtained.

In this case, even when particles are present on the joined surface (pasted surface) of the support member 40 or the joined surface (pasted side) of the inorganic layer 20, a level difference caused by the particles can also be absorbed by the elastic body layer 30, so that the generation of the stress can be prevented.

Furthermore, since the pressure applied to the piezoelectric single crystal substrate 1 during joining (pasting) is reduced by the elastic body layer 30, the occurrence of chipping or the like can be suppressed even in a state where the cleavability of the piezoelectric single crystal substrate 1 is high and ions are implanted.

Moreover, since the process control conditions can be relieved as described above, the process control can be facilitated.

By disposing the support member 40 on the piezoelectric thin film 10 through the elastic body layer 30, even when a difference in the coefficient of linear expansion between the piezoelectric thin film 10 and the support member 40 is high, a stress caused by the difference in the coefficient of linear expansion is absorbed by the elastic body layer 30. Thus, a necessity of including the coefficient of linear expansion in the selection conditions of the materials of the support member 40 is eliminated, so that the selectivity of the support member 40 increases. As a result, inexpensive materials can be selected and the cost of the support member 40 which occupies the volume of the acoustic wave device with a high ratio can also be reduced, so that an acoustic wave device can be realized at a low cost. Moreover, since materials excellent in processability can also be used for the support member 40, the process load to the support member 40 can also be reduced.

When the elastic body layer 30 is arranged to directly abut on the piezoelectric thin film 10, damping occurs as described above with respect to conventional devices. However, by inserting the inorganic layer 20 having an elastic modulus or hardness higher than that of the elastic body layer 30, the occurrence of damping can be prevented. Thus, a deterioration of the characteristics due to the structural factor by the use of the elastic body layer 30 can be suppressed.

Thus, the use of the configuration of this preferred embodiment realizes a piezoelectric device having high reliability and excellent characteristics at a low cost.

Furthermore, by the use of a material having high thermal conductivity for the inorganic layer 20, heat generated when the piezoelectric thin film 10 is driven is transmitted to the inorganic layer 20 to be dissipated. Therefore, power durability can be increased. Furthermore, by increasing also the thermal conductivity of the elastic body layer 30, the heat transmitted to the inorganic layer 20 is more effectively transmitted to the elastic body layer 30 to be dissipated from the elastic body layer 30 and the support member 40, so that the power durability can be further increased.

By using a material having a low coefficient of linear expansion for the inorganic matter layer 20, the elongation of the piezoelectric thin film 10 due to temperature changes or the like can be constrained by the inorganic layer 20, so that the temperature characteristics as an acoustic wave device can be improved.

By compounding an inorganic filler in the elastic body layer 30, the above-described elastic modulus, hardness, thermal conductivity, or coefficient of linear expansion can be determined as appropriate. Therefore, an acoustic wave device in accordance with the specification of reliability or the specification of characteristics can be easily realized. For example, the conditions such that the coefficient of linear expansion is about 20 ppm/° C. or lower, the thermal conductivity is about 0.5 W/(m·K) or more, and the elastic modulus is about 1 GPa or more which cannot be realized only by resin materials can also be realized while securing the adhesive strength during pasting by adjusting the volume ratio of the resin and the inorganic filler to about 50:50 to about 10:90, for example.

Thus, further by determining the composition of the inorganic layer 20 and the elastic body layer 30 as appropriate, a piezoelectric device having much higher reliability and more excellent characteristics can be realized at a low cost.

Next, a method for manufacturing the above-described piezoelectric device is described with reference to the drawings.

Figure 2:
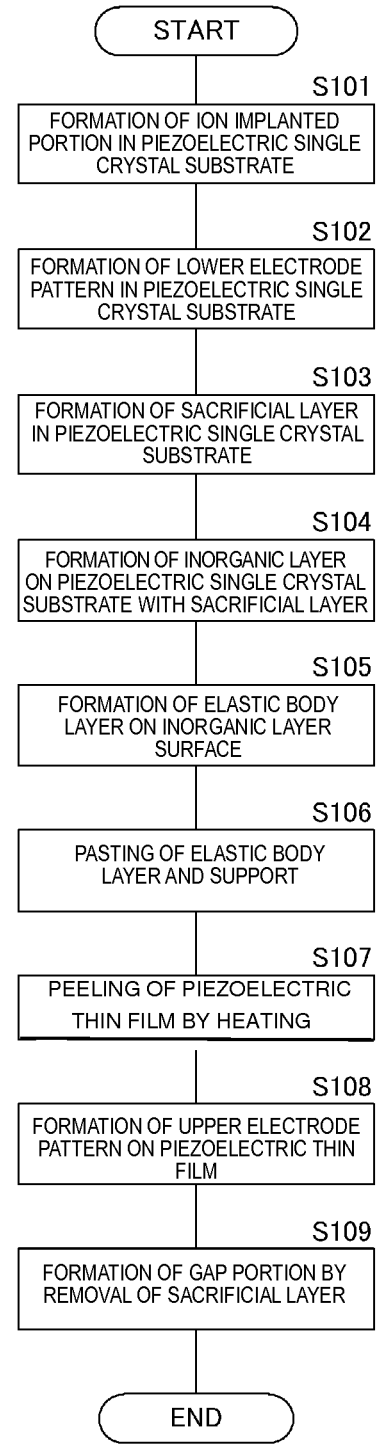
FIG. 2 is a flow chart illustrating a method for manufacturing the piezoelectric device according to the first preferred embodiment of the present invention.

FIG. 2 is a flow chart illustrating a method for manufacturing the piezoelectric device of a preferred embodiment of the present invention.

FIGS. 3, 4, and 5 are views schematically illustrating manufacturing processes of the piezoelectric device formed by the method illustrating in the manufacturing flow chart illustrated in FIG. 2.

Figure 3A:
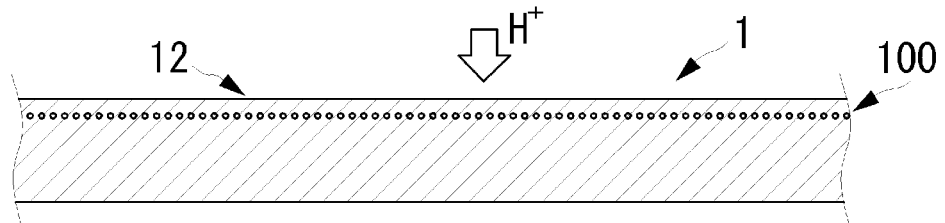
FIGS. 3A-3E are views schematically illustrating manufacturing processes of the piezoelectric device formed according to a manufacturing flow illustrated in FIG. 2.

First, a piezoelectric single crystal substrate 1 having a certain thickness is prepared. Then, hydrogen ions are implanted from the back surface 12 side as illustrated in FIG. 3A to thereby form an ion implanted portion 100 (FIG. 2: S101). In this case, as the piezoelectric single crystal substrate 1, a substrate on which a plurality of piezoelectric device simple substances are arranged is preferably used. When an LT substrate is used for the piezoelectric single crystal substrate 1, for example, by implanting the hydrogen ions with a dose amount of about $1.0 \times 10^{17}$ atom/cm$^2$ at an acceleration energy of about 150 KeV, a hydrogen distributed portion is formed at a depth of about 1 μm from the back surface 12, so that the ion implanted portion 100 is formed. The ion implanted portion 100 is a portion where the concentration of the ion elements implanted into the piezoelectric single crystal substrate reaches a peak. The ion implantation treatment conditions are determined as appropriate in accordance with the material of the piezoelectric single crystal substrate 1 and the thickness of the ion implanted portion 100. When the acceleration energy is adjusted to about 75 KeV, for example, a hydrogen distributed portion is formed at a depth of about 0.5 μm.

Figure 3B:
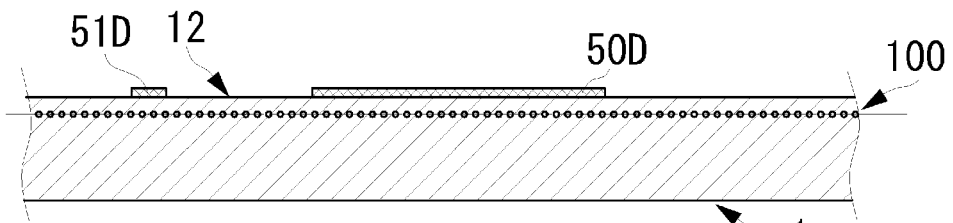

Next, as illustrated in FIG. 3B, the lower electrode 50D, the pad electrode 51D, and the drawing electrode 51LD, which is not illustrated, are formed on the back surface 12 of the piezoelectric single crystal substrate 1 (FIG. 2: S102).

Figure 3C:
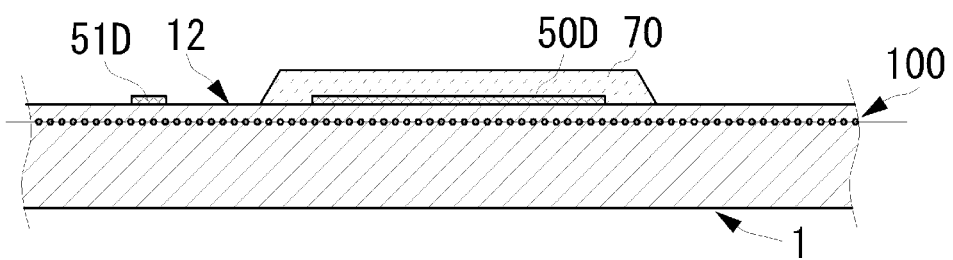

Next, as illustrated in FIG. 3C, the sacrificial layer 70 is formed on the back surface 12 of the piezoelectric single crystal substrate 1 (FIG. 2: S103). Herein, the sacrificial layer 70 is formed in a region having a certain area containing the lower electrode 50D, i.e., a region serving as a main functional portion as an F-BAR element. The sacrificial layer 70 is made of a material for which etching gas or an etching solution capable of differentiating the etching rate from that of the lower electrode 50D can selected and contains a material which is more easily etched than that of the lower electrode 50D. Moreover, the sacrificial layer 70 is made of a material which is more easily etched than the inorganic layer 20 described later or the piezoelectric single crystal substrate 1. It is more preferable for the sacrificial layer 70 to contain a material having resistance to electromigration. Specifically, the material is determined as appropriate in accordance with the conditions from metals, such as Ni, Cu, and, Al, insulation films, such as SiO$_2$, ZnO, PSG (phosphosilicate glass), organic films, and other suitable materials. The sacrificial layer 70 preferably is laminated and formed by vapor deposition, sputtering, CVD, or the like or is formed by spin coating or the like.

Figure 3D:
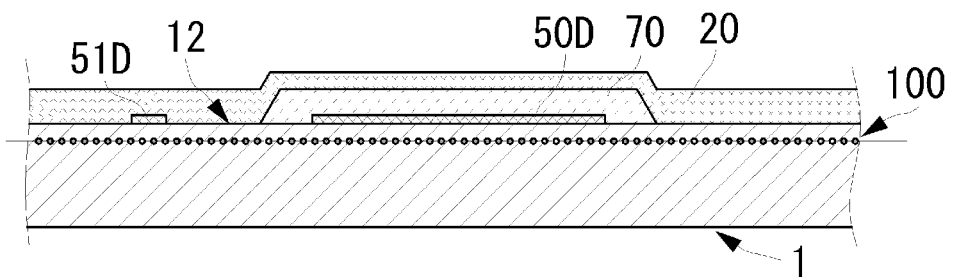

Next, as illustrated in FIG. 3D, the inorganic layer 20 is formed on the back surface 12 of the piezoelectric single crystal substrate 1 with the sacrificial layer 70 (FIG. 2: S104). As materials of the inorganic layer 20, materials satisfying the above-described elastic modulus, hardness, thermal conductivity, or coefficient of linear expansion are used and the thickness is determined as appropriate.

As a method for forming the inorganic layer 20, a joining method is not used and a method is determined as appropriate in accordance with the specification, manufacturing conditions, and the like from a CVD method which is a directly forming method, a vapor deposition method, such as a sputtering method and an E-B (electron beam) method, an ion plating method, a thermal spraying method, and a spray method. In this case, the inorganic layer 20 is formed at a temperature lower than the temperature of a peeling process described later.

The inorganic layer 20 is preferably formed under reduced pressure. Thus, by forming the inorganic layer 20 under reduced pressure, the generation of voids (foams) in the interface of the back surface 12 of the piezoelectric single crystal substrate 1 and the inorganic layer 20 is prevented and the like, so that the interface is densely formed. Thus, a highly reliable interface can be formed. Moreover, due to the fact the interface is stably and densely formed, a variation in reflection of acoustic waves on the interface or the like can be suppressed, so that the characteristics of an acoustic wave device can be improved and the stabilization of the characteristics can also be increased.

Figure 3E:
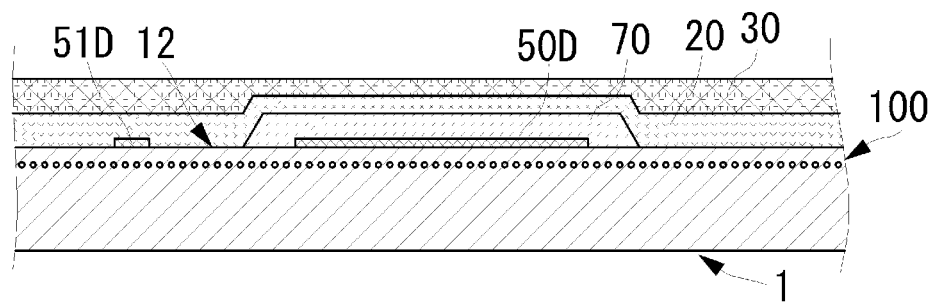

Next, as illustrated in FIG. 3E, the elastic body layer 30 is formed on the surface of the inorganic layer 20 opposite to the piezoelectric single crystal substrate 1 (FIG. 2: S105). As materials of the elastic body layer 30, materials satisfying an elastic modulus smaller than and hardness lower than those of the above-described inorganic layer 20 are used, and materials satisfying the above-described thermal conductivity and coefficient of linear expansion are more preferably used.

The formation method of the elastic body layer 30 is a coating method, for example. More specifically, as the coating method, the use of a spin coat method, a spray coat method, and a dispense method is more preferable. In this case, the coating thickness is determined as appropriate in accordance with the characteristics required as the elastic body layer 30 and the elastic modulus peculiar to the materials.

Figure 4A:
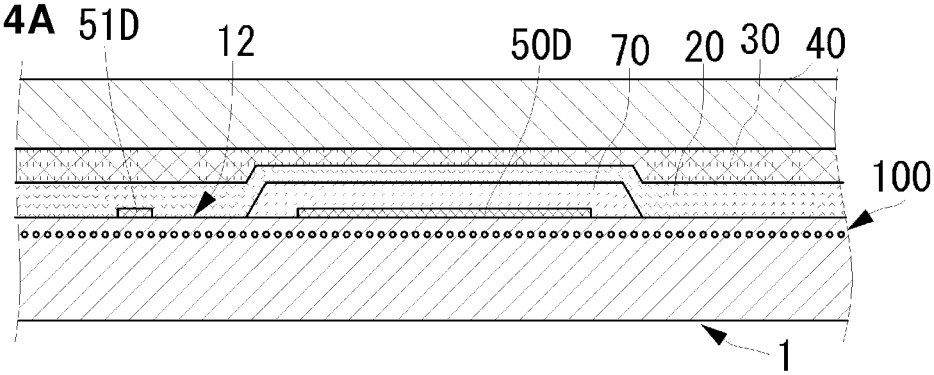
FIGS. 4A-4E are views schematically illustrating manufacturing processes of the piezoelectric device formed according to the manufacturing flow illustrated in FIG. 2.

Next, as illustrated in FIG. 4A, the support member 40 is pasted to the surface of the elastic body layer 30 opposite to the inorganic layer 20 (FIG. 2: S106). In this case, the pasting is performed under reduced pressure. Thus, by performing the pasting under reduced pressure, voids in the pasted interface of the elastic body layer 30 and the support member 40 can be suppressed. Thus, a piezoelectric device having high reliability can be formed.

Figure 4B:
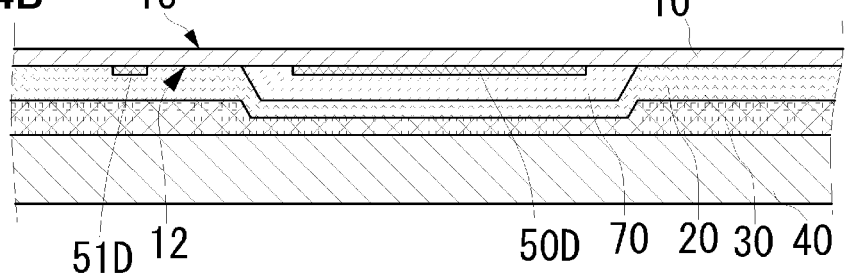

Next, as illustrated in FIG. 4B, a composite piezoelectric substrate containing the piezoelectric single crystal substrate 1 on which the inorganic layer 20, the elastic body layer 30, and the support member 40 are disposed is heated to thereby perform peeling using the ion implanted portion 100 as the peeling surface (FIG. 2: S107). Thus, the piezoelectric thin film 10 with the sacrificial layer 70 is formed and is supported by the support member 40 and on which the inorganic layer 20 and the elastic body layer 30 are disposed. In this case, the heating temperature can be made low when heated under reduced pressure.

Next, the front surface 13 of the piezoelectric thin film 10 which is peeling and formed as described above is polished by CMP treatment or the like to be flattened so that the surface roughness Ra becomes lower than about 1 nm, for example. Thus, the characteristics of an acoustic wave device can be improved. Then, polarization electrodes are formed on the upper and lower surfaces of the composite piezoelectric substrate containing the piezoelectric thin film 10, the inorganic layer 20, the elastic body layer 30, and the support member 40, and then a poling process is performed by applying a certain voltage to recover the piezoelectricity of the piezoelectric thin film 10. In this case, the sacrificial layer may be utilized for the polarization electrodes as a conductive material.

Figure 4C:
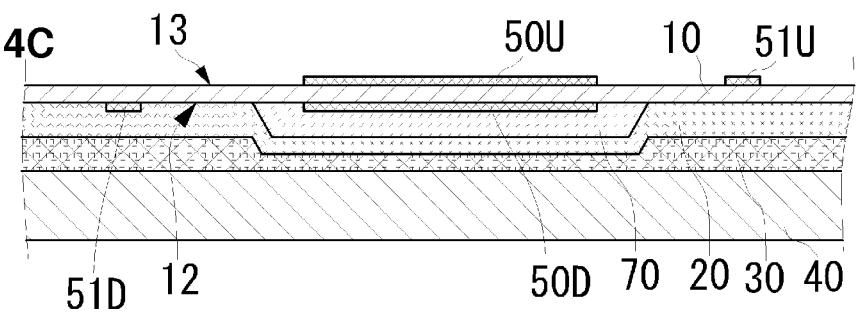

Next, as illustrated in FIG. 4C, an upper electrode pattern, such as the upper electrode 50U which drives as an F-BAR device or the pad electrode 51U, is formed on the front surface 13 of the piezoelectric thin film 10 (FIG. 2: S108).

Figure 4D:
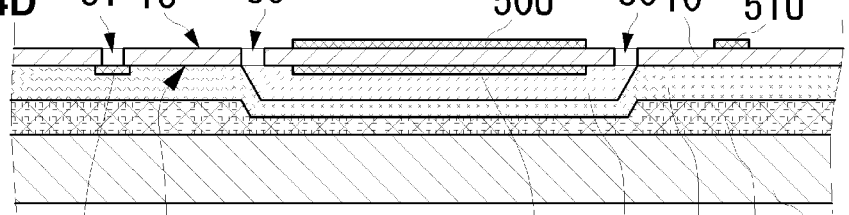

Next, as illustrated in FIG. 4D, the etching windows 80 for removing the sacrificial layer 70 and a through hole 81 for a via hole for conduction between the front surface 13 side and the back surface 12 side of the piezoelectric thin film 10 are formed in the piezoelectric thin film 10. In this case, the etching windows 80 are formed in the vicinity of the end portions of the formation region of the sacrificial layer 70 in the piezoelectric thin film 10. The through hole 81 is formed on the pad electrode 51D in the piezoelectric thin film 10. The etching windows 80 and the through hole 81 are formed by dry etching utilizing photolithography, for example. For the dry etching, NLD (Neural Loop Discharge)-RIE or SWP (Surface Wave Plasma)-RIE may be used, for example.

Figure 4E:
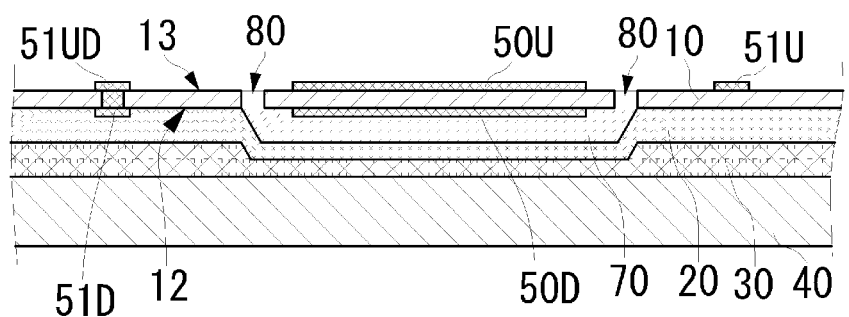

Next, as illustrated in FIG. 4E, a via hole electrode of the through hole 81, the pad electrode 51UD connected thereto, the upper drawing electrode 51LU connected to the pad electrode 51U, and the like are formed. The pad electrode 51C may be formed in this process or may be formed in the above-described process S108.

When passing through the processes so far, the composite is subjected to annealing treatment. By performing such annealing treatment, the crystallinity of the piezoelectric thin film 10 which has suffered crystal damage in the ion implantation process can be recovered, and elongation or curvature of the piezoelectric thin film 10 is suppressed. Thus, even when the gap layer 60 is formed in the next removal process of the sacrificial layer 70, a fracture of a portion (piezoelectric membrane portion) of the piezoelectric thin film 10 contacting the gap layer 60 can be prevented.

Figure 5A:
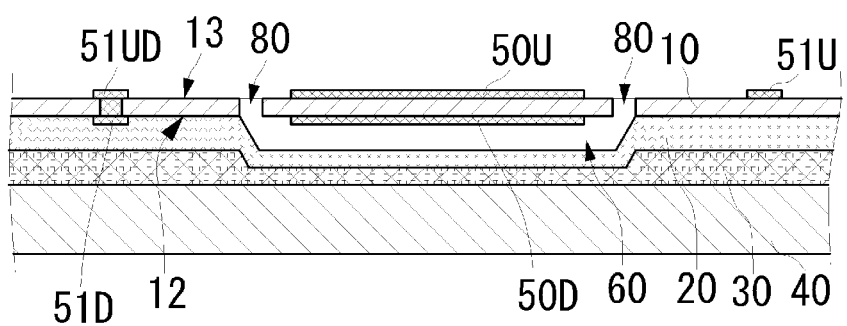
FIGS. 5A and 5B are views schematically illustrating manufacturing processes of the piezoelectric device formed according to the manufacturing flow illustrated in FIG. 2.

Next, the sacrificial layer 70 is removed by causing etching gas or an etching solution flow through the etching windows 80. Thus, a space where the sacrificial layer 70 is formed corresponding to the region where the lower electrode 50D and the upper electrode 50U are formed of the piezoelectric device serves as the gap layer 60 as illustrated in FIG. 5A (FIG. 2: S109).

Figure 5B:
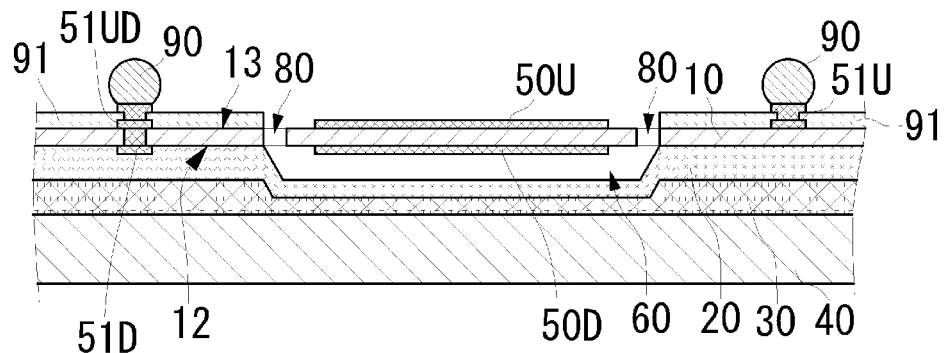

Next, as illustrated in FIG. 5B, the solder resist 91 is formed on the front surface 13 of the piezoelectric thin film 10 except for the top of each of the pad electrodes 51U, 51UD, and 51C and the gap layer 60. Then, a bump is formed on each of the pad electrodes 51U, 51UD, and 51C, and soldering balls 90 are formed on the bumps. Thus, a piezoelectric device for F-BAR including the membrane structure is formed.

By the use of the manufacturing method described above, a piezoelectric device in which the piezoelectric thin film 10, the inorganic layer 20, the elastic body layer 30, and the support member 40 are laminated and which includes the membrane structure can be manufactured with high reliability and excellent characteristics. Furthermore, the piezoelectric device can be manufactured without increasing the process load.

Next, a method for manufacturing a piezoelectric device according to yet another preferred embodiment is described with reference to the drawings. The piezoelectric device of the present preferred embodiment has a unique feature included in the manufacturing method thereof. The configuration as a final piezoelectric device is preferably the same as the piezoelectric device of the first preferred embodiment, and therefore the description of the configuration is omitted. Also in the manufacturing method, only characteristic portions are described and the description of the same processes as those of the first preferred embodiment is simplified.

Figure 6:
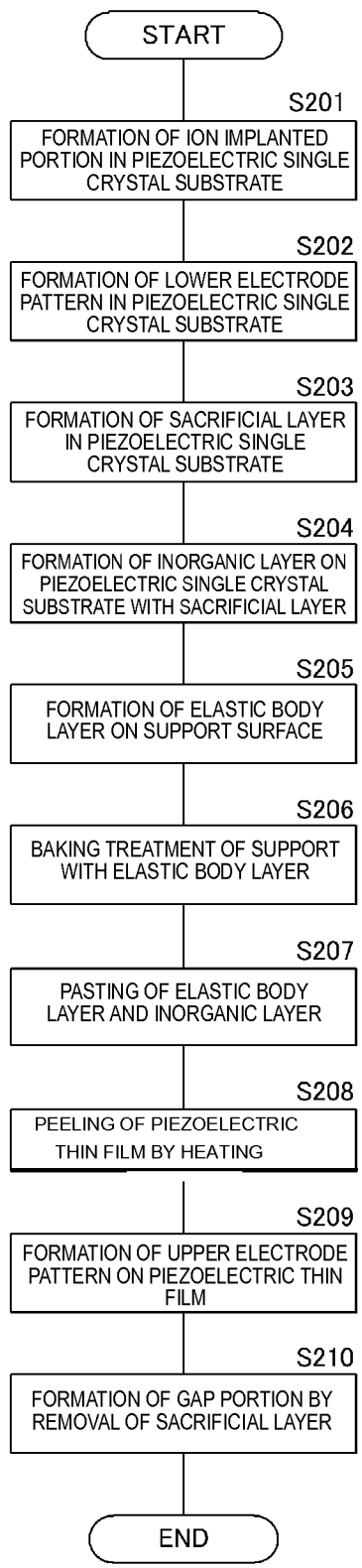
FIG. 6 is a flow chart illustrating the method for manufacturing the piezoelectric device according to the first preferred embodiment of the invention.

FIG. 6 is a flow chart illustrating the method for manufacturing the piezoelectric device of the present preferred embodiment.

FIGS. 7A-7E are views schematically illustrating characteristic processes different from the processes of the first preferred embodiment in the manufacturing process of the piezoelectric device formed by the method illustrated in the manufacturing flow chart of FIG. 6.

First, as illustrated in FIG. 7A, the processes until the inorganic layer 20 is formed on the piezoelectric single crystal substrate 1 with the sacrificial layer 70 preferably are the same as those of the first preferred embodiment (FIG. 6: S201 to S204).

Separate from these processes, the elastic body layer is formed on the surface of the support member 40 as illustrated in FIG. 7B (FIG. 6: S205). The material and the formation method of the elastic body layer 30 are preferably the same as those of the first preferred embodiment.

Next, the support member 40 with the elastic body layer 30 is subjected to baking treatment at a certain temperature (FIG. 6: S206). For example, in a case of manufacturing an acoustic wave device to be used at about 300° C. or higher, the baking treatment is performed at a temperature in which a certain margin is added to the use condition temperature. By performing such a baking treatment, a solvent and the like are emitted from the elastic body layer 30 during the baking treatment at a temperature equal to or higher than the temperature which is not used in the manufacturing method of the first preferred embodiment and the use environment of the piezoelectric device, e.g., under an environment of about 300° C. or higher. Thus, annealing treatment is performed in accordance with a use situation, and the occurrence of a deterioration of the characteristics of the piezoelectric device during use can be prevented.

Herein, such a baking treatment cannot be carried out in the manufacturing method of the first preferred embodiment. This is because when heat of about 300° C. or higher is applied to the composite piezoelectric substrate containing the piezoelectric single crystal substrate 1, the inorganic layer 20, and the elastic body layer 30, the piezoelectric single crystal substrate 1 is peeled at the ion implanted portion 100 to be formed into a thin film. However, the use of the manufacturing method of this preferred embodiment can prevent the peeling and formation of the piezoelectric thin film 10 before the peeling process.

Next, the elastic body layer 30 formed on the support member 40 and the inorganic layer 20 formed on the piezoelectric single crystal substrate 1 with the sacrificial layer 70 are pasted to each other as illustrated in FIG. 7C (FIG. 6: S207). In this case, the surface of the inorganic layer 20 is flattened. The process conditions of the pasting process may be the same as those of the first preferred embodiment.

Then, the piezoelectric thin film is formed by heating and peeling (FIG. 6: S208) and the formation of the upper electrode pattern is performed (FIG. 6: S209) preferably under the same conditions as those of the first preferred embodiment. Furthermore, preferably under the same conditions as those of the first preferred embodiment, the sacrificial layer 70 is removed to form the gap layer 60 (FIG. 6: S210), and finally, a piezoelectric device having the shape illustrated in FIGS. 1A and 1B is formed.

As described above, by the use of the manufacturing method of the present preferred embodiment, a piezoelectric device which is formed according to the process flow in which the temperature is about 300° C. or high can also be certainly manufactured with high reliability while maintaining excellent characteristics.

Although in the above-described preferred embodiments, an example of using a support member in the shape of a plate is described, a support member having a concave portion in a region corresponding to the membrane structure as illustrated in FIG. 8 may be used.

FIG. 8 is a side cross sectional view illustrating the configuration of a piezoelectric device having another configuration according to another preferred embodiment of the present invention. In the case of such a configuration, it is also realizable to make the thickness of the elastic body layer or the inorganic layer uniform.

Moreover, the above-described preferred embodiments describe a piezoelectric device for F-BAR that preferably includes the upper electrode and the lower electrode facing each other on both surfaces of the piezoelectric thin film and having the membrane structure. However, the above-described configuration can be applied also to other piezoelectric devices having the membrane structure. For example, FIGS. 9A and 9B are a side view illustrating the configuration of an acoustic wave device of the invention and a plan view as viewed from the mounting surface side thereof.

Figure 9A:
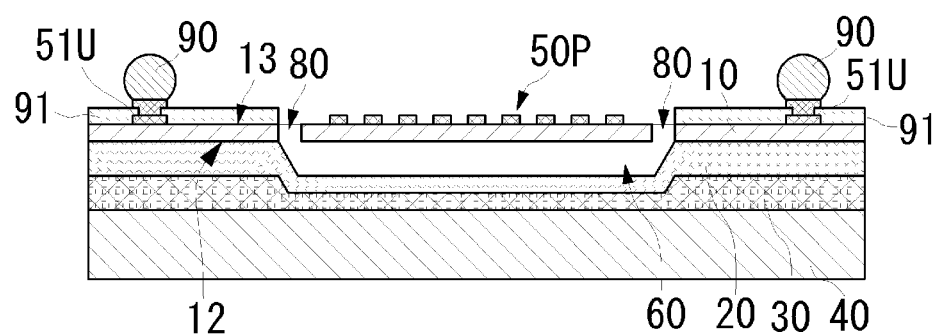
FIGS. 9A and 9B are a side view illustrating the configuration of a surface acoustic wave device having the configuration of the invention and a plan view as viewed from the mounting surface side thereof.
Figure 9B:
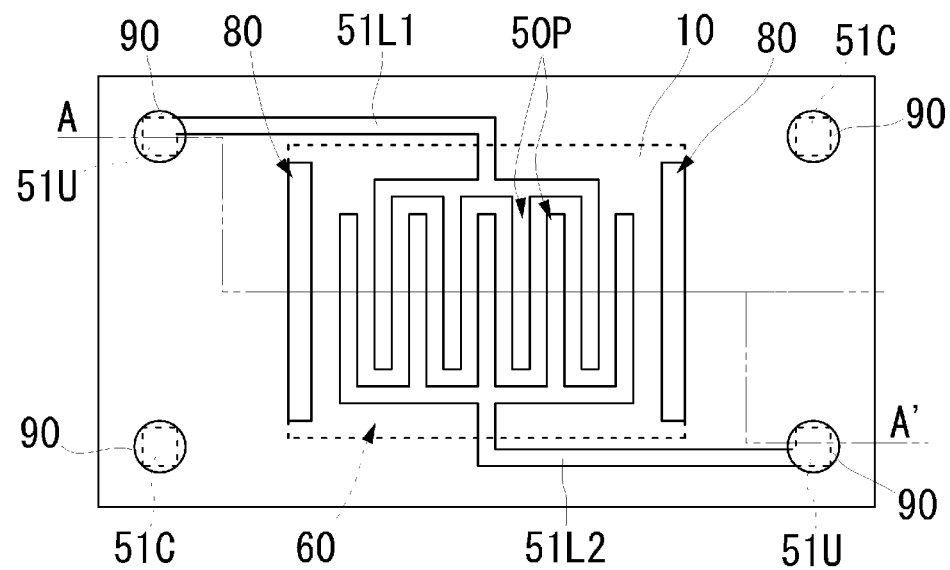

The acoustic wave device illustrated in FIGS. 9A and 9B preferably is an example of an acoustic wave device using a Lamb wave, a plate wave, or the like in which IDT electrodes 50P and drawing electrode 51L1 and 51L2 are formed on the front surface 13 of the piezoelectric thin film 10 in place of the upper electrodes 50U and 50D and the upper drawing electrode 51LU of the piezoelectric device for F-BAR described above. Furthermore, in the acoustic wave device, the electrodes on the back surface 12 side of the piezoelectric thin film 10 are not formed in contrast to the piezoelectric device for F-BAR. Even in the case of such an acoustic wave device, the above-described configuration can be utilized and the same effects obtained in the above-described piezoelectric device for F-BAR and the manufacturing method thereof can be obtained.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A method for manufacturing a piezoelectric device comprising:
    an ion implantation process for implanting ionized elements into a piezoelectric substrate to thereby form a portion in which a concentration of elements implanted into the piezoelectric substrate reaches a peak in the piezoelectric substrate;
    a sacrificial layer formation process for forming a sacrificial layer on a surface at the ion implanted side of the piezoelectric substrate;
    an inorganic layer formation process for directly forming an inorganic layer on a surface at the ion implanted side of the piezoelectric substrate on which the sacrificial layer is formed;
    an elastic body layer disposing process for disposing an elastic body layer on a surface opposite to the piezoelectric substrate of the inorganic layer;
    a pasting process for pasting a support member to the elastic body layer;
    a peeling process for peeling and forming a piezoelectric thin film from the piezoelectric substrate in which the portion in which the concentration of the elements implanted into the piezoelectric substrate reaches the peak is formed; and
    a sacrificial layer removal process for removing the sacrificial layer to thereby form a gap layer.

2. The method for manufacturing the piezoelectric device according to claim 1, wherein the pasting process is performed under reduced pressure.

3. The method for manufacturing the piezoelectric device according to claim 1, wherein the inorganic layer formation process is performed under reduced pressure.

4. A method for manufacturing a piezoelectric device comprising:
    an ion implantation process for implanting ionized elements into a piezoelectric substrate to thereby form a portion in which a concentration of elements implanted into the piezoelectric substrate reaches a peak in the piezoelectric substrate;
    a sacrificial layer formation process for forming a sacrificial layer on a surface at the ion implanted side of the piezoelectric substrate;
    an inorganic layer formation process for directly forming an inorganic layer on a surface at the ion implanted side of the piezoelectric substrate on which the sacrificial layer is formed;
    an elastic body layer disposing process for disposing an elastic body layer on a front surface of a support member;
    a pasting process for pasting the inorganic layer and the elastic body layer;
    a peeling process for peeling and forming a piezoelectric thin film from the piezoelectric substrate in which the portion where the concentration of the elements implanted into the piezoelectric substrate reaches the peak is formed; and
    a sacrificial layer removal process for removing the sacrificial layer to thereby form a gap layer.

5. The method for manufacturing the piezoelectric device according to claim 4, wherein the pasting process is performed under reduced pressure.

6. The method for manufacturing the piezoelectric device according to claim 4, wherein the inorganic layer formation process is performed under reduced pressure.

* * * * *